United States Patent [19]

Hasegawa

[11] 4,064,757

[45] Dec. 27, 1977

[54] GLASSY METAL ALLOY TEMPERATURE SENSING ELEMENTS FOR RESISTANCE THERMOMETERS

[75] Inventor: Ryusuke Hasegawa, Morristown, N.J.

[73] Assignee: Allied Chemical Corporation, Morris Township, N.J.

[21] Appl. No.: 733,628

[22] Filed: Oct. 18, 1976

[51] Int. Cl.[2] ...................... C22C 16/00; C22C 25/00; G01R 19/00

[52] U.S. Cl. ................................ 73/362 AR; 29/619; 75/1; 75/134 F; 75/150; 75/177; 338/22 R; 338/25

[58] Field of Search ....................... 338/22, 13, 20, 25; 29/610, 619; 73/362 AR; 75/175.5, 177, 150, 134 N

[56] References Cited

U.S. PATENT DOCUMENTS

| | | | |
|---|---|---|---|
| 3,271,591 | 9/1966 | Ovshinsky et al. | 338/20 X |
| 3,571,673 | 3/1971 | Ovshinsky et al. | 317/234 |
| 3,644,863 | 2/1972 | Tsuei | 338/25 |
| 3,989,517 | 11/1976 | Tanner et al. | 75/175.5 |

*Primary Examiner*—Arthur J. Steiner

*Attorney, Agent, or Firm*—David W. Collins; Ernest A. Polin

[57] ABSTRACT

Glassy metal alloys of compositions in the Be-Ti-Zr system suitable as temperature sensing elements for resistance thermometers are provided. The compositions consist essentially of about 20 to 45 atom percent beryllium, about 2 to 80 atom percent zirconium, 0 to about 2 atom percent of at least one metal of vanadium, chromium, manganese, iron, nickel and cobalt, and the balance essentially titanium and incidental impurities. The alloys of the invention combine a high temperature coefficient of resistance and negligible temperature-dependent magneto-resistance.

18 Claims, 3 Drawing Figures

GLASSY METAL ALLOY TEMPERATURE SENSING ELEMENTS FOR RESISTANCE THERMOMETERS

BACKGROUND OF THE INVENTION

1. Field of the Invention

This invention relates to resistance thermometers especially useful for measuring cryogenic temperatures, and more particularly, to glassy metal alloys suitable as temperature sensing elements for resistance thermometers.

2. Description of the Prior Art

In conventional resistance thermometers having a metallic sensing element, the electrical resistivity decreases with decreasing temperature, with both the resistivity and its temperature coefficient reaching very low values when approaching absolute zero. Thus, conventional metallic resistance thermometers, such as platinum, become less sensitive with decreasing temperature and are essentially ineffective below about 20° K.

Glassy metal resistance thermometers have been disclosed in U.S. Pat. No. 3,644,863, issued Feb. 22, 1972 to C.-C. Tsuei. The composition of the temperature sensing elements of these resistance thermometers comprises a matrix of a first component which is a metal of the platinum series (ruthenium, rhodium, palladium, osmium, iridium and platinum) and a second component which is silicon or germanium. To that two-component matrix is added a third component which is selected from the inner members of the first series of transition metals of titanium, vanadium, chromium, manganese, iron and cobalt. The glassy metal temperature sensing elements are formed as splats. The resistivity of these compositions is disclosed as decreasing with decreasing temperature down to some definite critical temperature. Below that critical temperature, however, the direct dependence upon temperature is reversed and the resistivity increases with decreasing temperature. Thus, glassy metal alloys with negative temperature coefficient of resistivity over a usefully wide low temperature range are obtained. However, these palladium-silicon base glassy metal alloy resistance thermometers evidence room temperature resistivities of only about 83 to 150 $\mu$ohm-cm and a substantial field-dependent magnetoresistance and hence are not totally suitable in low temperature cryogenic applications.

Novel glassy metal alloys in wire form have been disclosed by H. S. Chen and D. E. Polk in U.S. Pat. No. 3,856,513, issued Dec. 24, 1974. These glassy metal alloys are represented by the formula $T_iX_j$, where T is at least one transition metal, X is at least one element selected from the group consisting of aluminium, antimony, beryllium, boron, germanium, carbon, indium, phosphorus, silicon and tin, "i" ranges from about 70 to 87 atom percent and "j" ranges from about 13 to 30 atom percent. However, no compositions suitable for use as temperature sensing elements in cryogenic resistance thermometers are disclosed therein.

Glassy metal alloys prepared from compositions in the beryllium-titanium-zirconium system are known; see, e.g., L. E. Tanner et al., Application Ser. No. 709,028, filed July 26, 1976. The glassy alloys comprise about 30 to 55 atom percent Be, 0 to about 58 atom percent Ti, and about 2 to 65 atom percent Zr. The alloys are disclosed as evidencing high strength, low density and good ductility and are useful in applications requiring a high strength-to-weight ratio. No disclosure as to their electrical resistance properties or their suitability as temperature sensing elements in cryogenic resistance thermometers is made, however.

SUMMARY OF THE INVENTION

In accordance with the invention, a temperature sensing element is provided comprising (1) a body of a metal alloy that is at least 50% glassy and (2) electrically conductive leads attached thereto. The composition of the glassy metal alloy consists essentially of about 20 to 45 atom percent beryllium, about 2 to 80 atom percent zirconium, 0 to about 2 atom percent of at least one metal selected from the group consisting of vanadium, chromium, manganese, iron, nickel and cobalt, and the balance essentially titanium and incidental impurities. Also provided is a process for fabricating the temperature sensing element, which comprises forming the glassy metal alloy body and attaching electrically conductive leads thereto.

A novel composition of matter is also provided, comprising a metal alloy that is at least 50% glassy having a composition consisting essentially of about 20 to 45 atom percent beryllium, about 2 to 80 atom percent zirconium, about 0.5 to 2 atom percent of at least one metal selected from the group consisting of vanadium, chromium, manganese, iron, nickel and cobalt, and the balance essentially titanium and incidental impurities.

The alloys of the invention have higher resistivities and temperature coefficients of resistance than previously disclosed palladium-silicon glassy alloys over wide temperature ranges, with negligible temperature-dependent magnetoresistance. Further, these alloys are easily fabricable as filaments, i.e., as ribbons and wires, which are highly suited for fabrication of resistance thermometers.

DETAILED DESCRIPTION OF THE INVENTION

Resistance thermometers for low temperature measurements typically comprise a temperature sensing element which is electrically connected to an associated bridge or other means for obtaining a temperature indication. The sensing element typically comprises a body of material, usually in wire or ribbon form, having a well-defined temperature dependence of resistivity and high sensitivity. Electrical leads are attached or adhered to the sensing element to provide a signal for the temperature indication means.

Figure 1:
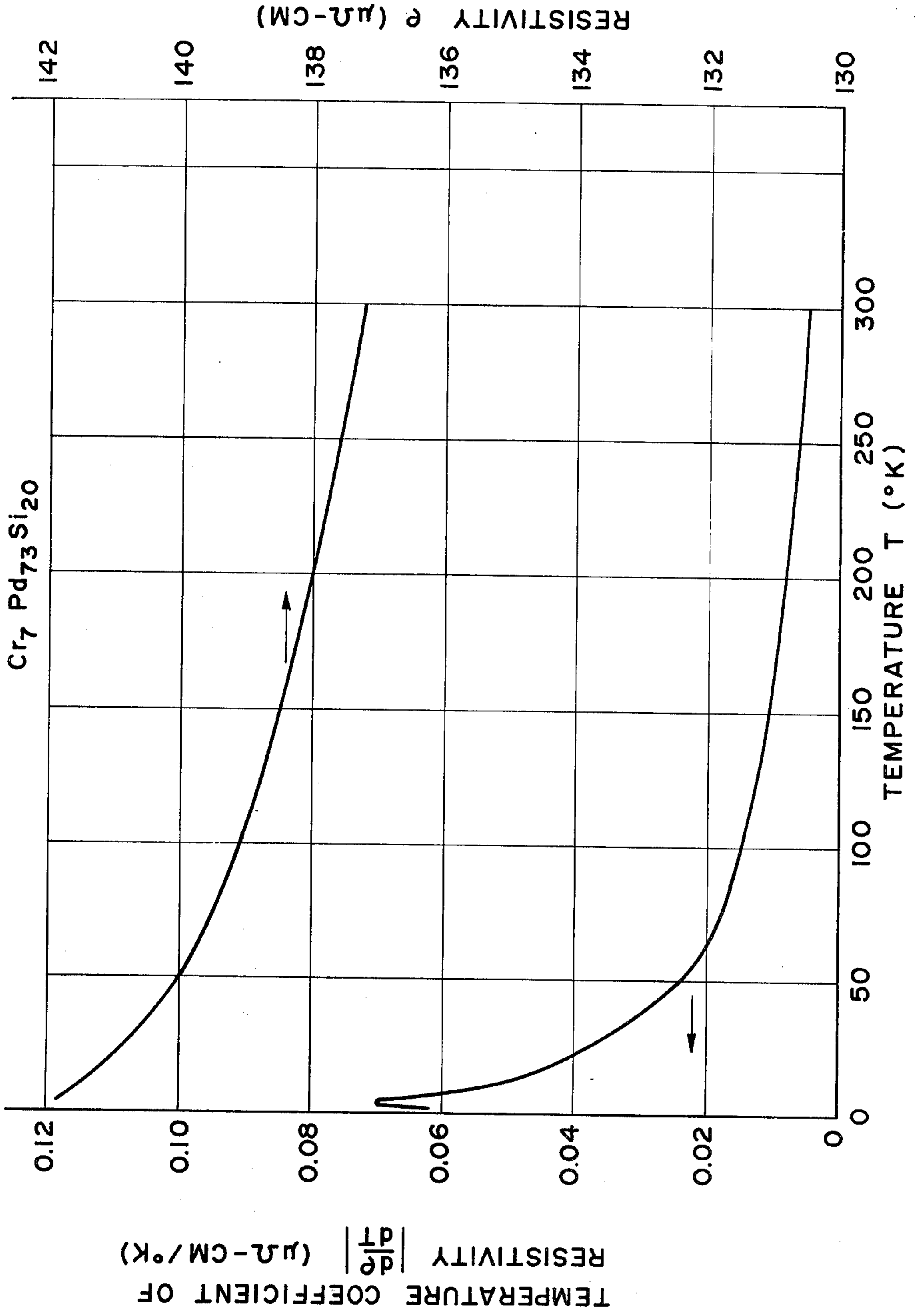
FIG. 1 (PRIOR ART)
FIG. 1, on coordinates of $\mu$ohm-cm and ° K and on coordinates of $\mu$ohm-cm/° K and ° K, depicts resistivity and temperature coefficient of resistivity, both as a function of temperature, for a prior art glassy metal alloy having the composition $Cr_7Pd_{73}Si_{20}$.

Prior art crystalline and glassy metal alloys generally possess a resistance that decreases with decreasing temperature, although some glassy alloys, such as $Cr_7Pd_{73}Si_{20}$, possess a desirable resistance that increases with decreasing temperature, as depicted in FIG. 1. The prior art alloy depicted in FIG. 1, however, has an undesirable temperature coefficient of resistivity that reaches a maximum value in the temperature range of about 5° K. Such aberrational behavior reduces sensitivity in an important temperature range.

In accordance with the invention, a temperature sensing element is provided comprising (1) a body of a metal alloy that is at least 50% glassy and (2) electrically conductive leads attached thereto. The composition of the glassy metal alloy consists essentially of about 20 to 45 atom percent beryllium, about 2 to 80 atom percent zirconium, 0 to about 2 atom percent of at least one metal selected from the group consisting of vanadium, chromium, manganese, iron, nickel and cobalt, and the balance essentially titanium and incidental impurities.

The alloys of the invention have higher resistivities and temperature coefficients of resistance than previously disclosed palladium-silicon glassy alloys over wide temperature ranges, with negligible temperature-dependent magnetoresistance. Further, these alloys are easily fabricable in both ribbon and wire form, which are highly suited for fabrication of resistance thermometers.

Figure 2:
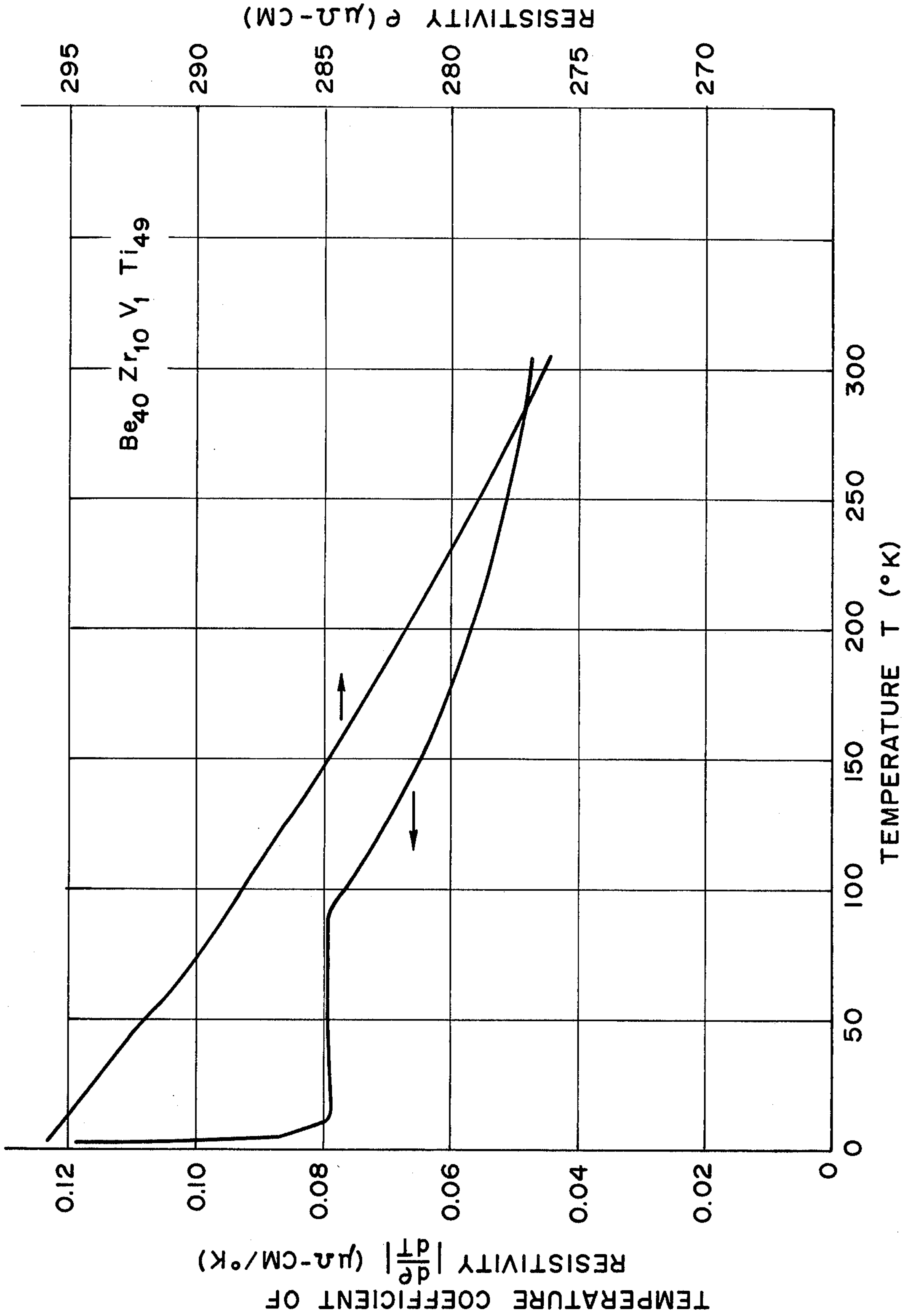
FIG. 2, on coordinates of $\mu$ohm-cm and ° K and on coordinates of $\mu$ohm-cm/° K and ° K, depicts resistivity and temperature coefficient of resistivity, both as a function of temperature, for a glassy metal alloy of the invention having the composition $Be_{40}Zr_{10}V_1Ti_{49}$.
Figure 3:
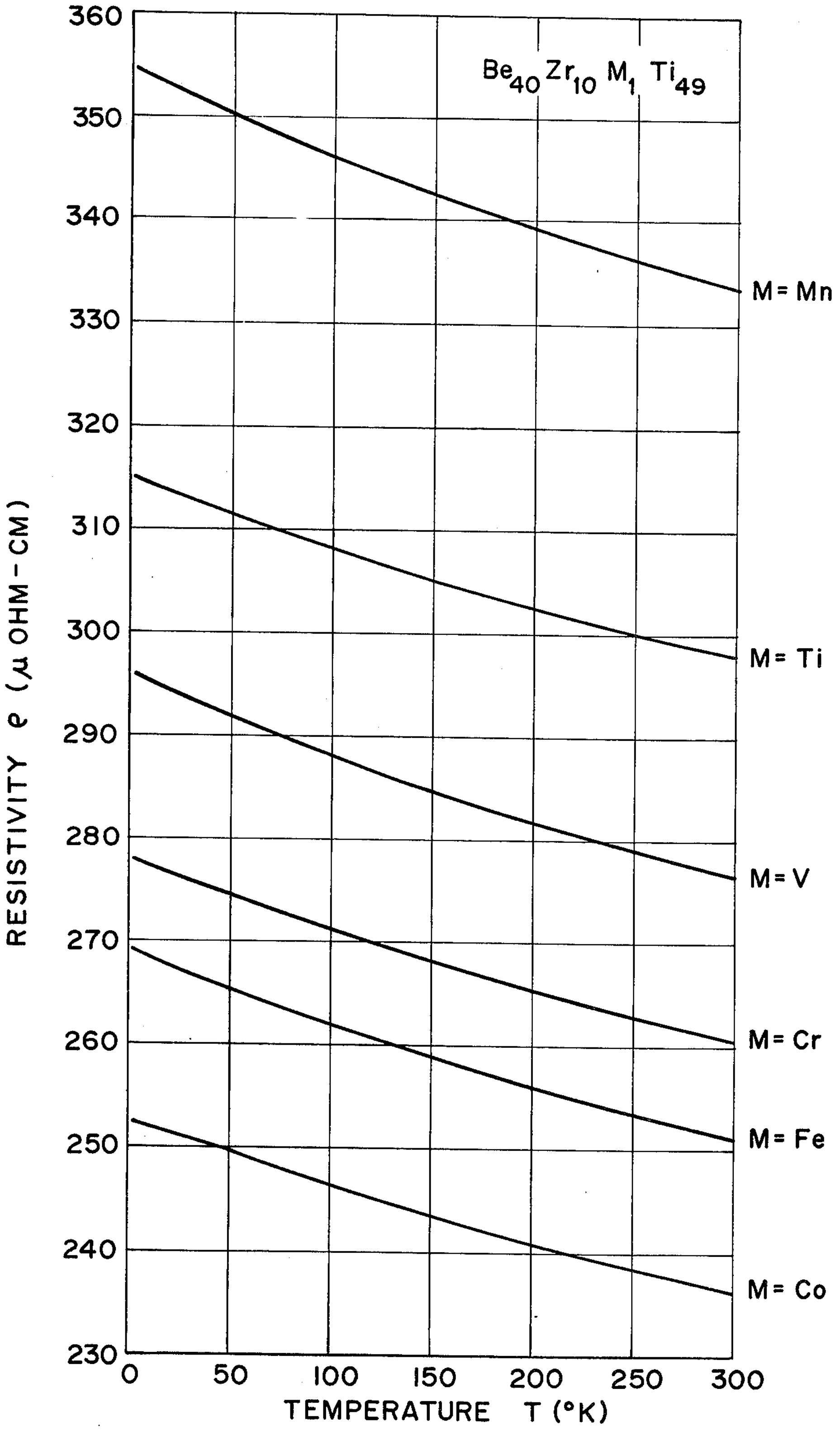
FIG. 3, on coordinates of $\mu$ohm-cm and ° K, depicts resistivity as a function of temperature for several glassy metal alloys of the invention having the composition $Be_{40}Zr_{10}M_1Ti_{49}$, where M is a metal selected from the group consisting of Co, Fe, Cr, V, Ti and Mn.

The room temperature resistivity of the alloys of the invention is in excess of 200 $\mu$ohm-cm, with many alloys evidencing room temperature resistivities in excess of 300 $\mu$ohm-cm. These high values are retained over a wide range of temperature, and increase with decreasing temperature. FIG. 2 depicts the temperature dependence of resistivity and temperature coefficient of resistivity for a glassy metal alloy of the invention having the composition $Be_{40}Zr_{10}V_1Ti_{49}$. Comparison with FIG. 1 clearly demonstrates the improvement in both resistivity and temperature coefficient of resistivity. FIG. 3 depicts the temperature dependence of a series of glassy metal alloys of the invention having the composition $Be_{40}Zr_{10}M_1Ti_{49}$, where M is a metal selected from the group consisting of V, Cr, Mn, Fe and Co. Included for comparison is the base alloy $Be_{40}Zr_{10}Ti_{50}$, which also evidences a high resistivity. The dependence of temperature coefficient of resistivity on temperature of $Be_{40}Zr_{10}Ti_{50}$ is similar to that of $Be_{40}Zr_{10}V_1Ti_{49}$, but is about 0.01 $\mu$ohm-cm/° K lower.

The compositions useful in the practice of the invention broadly consist essentially of about 20 to 45 atom percent beryllium, about 2 to 80 atom percent zirconium, 0 to about 2 atom percent of at least one metal selected from the group consisting of vanadium, chromium, manganese, iron, nickel and cobalt, and the balance essentially titanium and incidental impurities. Outside this range, either the compositions cannot be easily quenched to form ductile glassy alloys or they do not possess the desirable characteristics of high resistivity and/or temperature coefficient of resistivity. For example, compositions containing less than about 2 atom percent zirconium or greater than about 2 atom percent of vanadium, chromium, manganese, iron, nickel and/or cobalt do not easily form glassy compositions.

The addition of up to about 2 atom percent of at least one of the specified metals increases the slope of the temperature coefficient of resistivity, thus providing greater sensitivity at low temperatures. Preferably, at least about 0.5 atom percent of at least one of the specified metals is added. Addition of about 0.5 to 1.5 atom percent of at least one of the specified metals, when combined with about 35 to 45 atom percent beryllium, about 2 to 65 atom percent zirconium, and the balance essentially titanium and incidental impurities, results in a highly ductile, easily quenched glassy alloy, and accordingly, such compositions are preferred.

Most preferred is a composition consisting essentially of about 38 to 42 atom percent beryllium, 8 to 12 atom percent zirconium, about 1 atom percent of at least one of the specified metals, and the balance essentially titanium and incidental impurities. Since vanadium and manganese provide the greatest slope of resistivity as a function of temperature, compositions containing about 1 atom percent of at least one of the metals of vanadium and manganese are especially preferred.

The glassy metal alloys of the invention are formed by cooling a melt of the desired composition at a rate of at least about $10^5$° C/sec, employing well-known glassy metal alloy quenching techniques. The purity of all compositions is that found in normal commercial practice.

A variety of techniques are available, as is now well-known in the art, for fabricating splat-quenched foils and rapid-quenched continuous ribbon, wire, sheet, powder, etc. Typically, a particular composition is selected, powders or granules of the requisite elements in the desired portions are melted and homogenized, and the molten alloy is rapidly quenched on a chill surface, such as a rapidly rotating cylinder. Due to the highly reactive nature of these compositions, it is preferred that the alloys be fabricated in an inert atmosphere or in a partial vacuum.

While glassy metal alloys were defined earlier as being at least 50% glassy, a higher degree of glassiness yields a higher degree of ductility. Accordingly, glassy metal alloys that are substantially glassy, that is, at least about 80% glassy are preferred. Even more preferred are totally glassy alloys. The degree of glassiness is conveniently determined by well-known X-ray diffraction techniques.

The magnetoresistance $\rho(H)$ at 4.2° K for the glassy metal alloys of the invention varies as $$\Delta\rho/\rho_o = [\rho(H)-\rho(o)]/\rho(o) = A(H-H_o)$$

where H is the applied field and $H_o$ is 1 kOe. Since A is experimentally determined to be less than $5 \times 10^{-8}$/Oe, $\Delta\rho$ is less than 0.05% at K = 10 kOe, which gives a temperature error of less than 0.2° K at T = 4.2° K and H = 10 kOe. For H less than 1 kOe, $\Delta\rho$ is essentially zero. Thus, for most thermometer applications in which the environmental field is less than 1 kOe, the magnetoresistance noted here is substantially zero. At T = 77° and 295° K, $\Delta\rho$ is essentially zero up to H = 9.5 kOe. This property of negligible temperature-dependent magnetoresistance, combined with the less-corrosive and radiation damage-free features of glassy metal alloys in general, makes the glassy metal alloys of the invention especially useful as temperature sensing elements in resistance thermometers, particularly at cryogenic temperatures.

EXAMPLES

Ribbons of glassy metal alloys of the invention about 1 to 2 mm wide and about 40 to 50 $\mu$m thick were formed by squirting a melt of the particular composition by overpressure of argon onto a rapidly rotating copper chill wheel (surface speed about 3000 to 6000 ft/min) in a partial vacuum of absolute pressure of about 200 $\mu$m of Hg. Glassiness was determined by X-ray diffraction. A cooling rate of at least about $10^5$° C/sec was attained.

The resistivity at room temperature was measured for several alloys; these results are tabulated in the Table below.

TABLE

Room Temperature Resistivity of Alloys of the Invention

| Composition (Atom Percent) | | | | |
|---|---|---|---|---|
| Be | Zr | M | Ti | Resistivity, μohm-cm |
| 30 | 70 | — | — | 324.2 |
| 35 | 65 | — | — | 283.1 |
| 40 | 60 | — | — | 269.0 |
| 45 | 55 | — | — | 298.0 (ave.) |
| 30 | 65 | — | 5 | 265.0 |
| 35 | 60 | — | 5 | 224.9 |
| 40 | 55 | — | 5 | 282.6 |
| 45 | 50 | — | 5 | 303.3 |
| 30 | 60 | — | 10 | 247.3 |
| 35 | 55 | — | 10 | 296.1 |
| 40 | 50 | — | 10 | 317.5 |
| 45 | 45 | — | 10 | 328.5 (ave.) |
| 35 | 50 | — | 15 | 333.6 |
| 40 | 45 | — | 15 | 292.5 |
| 45 | 40 | — | 15 | 265.1 |
| 30 | 50 | — | 20 | 291.0 |
| 35 | 45 | — | 20 | 306.2 |
| 40 | 40 | — | 20 | 278.7 |
| 45 | 35 | — | 20 | 297.8 |
| 40 | 36 | — | 24 | 303.8 |
| 30 | 45 | — | 25 | 267.3 |
| 35 | 40 | — | 25 | 335.9 |
| 45 | 30 | — | 25 | 360.1 |
| 30 | 40 | — | 30 | 241.6 |
| 35 | 35 | — | 30 | 275.4 |
| 40 | 30 | — | 30 | 366.4 |
| 45 | 25 | — | 30 | 294.0 |
| 30 | 35 | — | 35 | 264.4 |
| 35 | 30 | — | 35 | 291.1 |
| 40 | 25 | — | 35 | 302.3 |
| 30 | 30 | — | 40 | 262.8 |
| 35 | 25 | — | 40 | 307.5 |
| 40 | 20 | — | 40 | 313.0 |
| 45 | 15 | — | 40 | 354.8 |
| 30 | 45 | — | 45 | 307.1 |
| 35 | 20 | — | 45 | 371.7 |
| 40 | 15 | — | 45 | 272.5 |
| 40 | 12 | — | 48 | 283.5 |
| 30 | 20 | — | 50 | 310.1 |
| 35 | 10 | — | 50 | 309.5 |
| 40 | 10 | — | 50 | 301.1 |
| 40 | 10 | 1-Co | 49 | 236.5 |
| 40 | 10 | 1-Fe | 49 | 251.8 |
| 40 | 10 | 1-Cr | 49 | 256.7 |
| 40 | 10 | 1-V | 49 | 276.7 |
| 40 | 10 | 1-Ni | 49 | 283.0 |
| 40 | 10 | 1-Mn | 49 | 334.0 |
| 40 | 6 | — | 54 | 280.0 |
| 35 | 10 | — | 55 | 344.2 |
| 40 | 2 | — | 58 | 307.7 |

In addition, the resistivity and the coefficient of resistivity, both as a function of temperature, were measured for several preferred alloy compositions. These results are depicted in FIGS. 2 and 3, discussed previously.

What is claimed is:

1. A temperature sensing element, comprising for low temperature resistance thermometers a. a body of a metal alloy that is at least 50% glassy having a composition consisting essentially of about 20 to 45 atom percent beryllium, about 2 to 80 atom percent zirconium, about 0.5 to about 2 atom percent of at least one metal selected from the group consisting of vanadium, chromium, manganese, iron, nickel and cobalt, and the balance essentially titanium and incidental impurities; and b. electrically conductive leads attached thereto.

2. The temperature sensing element of claim 1 in which the composition consists essentially of about 35 to 45 atom percent beryllium, about 2 to 65 atom percent zirconium, about 0.5 to 1.5 atom percent of at least one metal selected from the group consisting of vanadium, chromium, manganese, iron, nickel and cobalt, and the balance essentially titanium and incidental impurities.

3. The temperature sensing element of claim 2 in which the composition consists essentially of about 38 to 42 atom percent beryllium, about 8 to 12 atom percent zirconium, about 1 percent of at least one metal selected from the group consisting of vanadium, chromium, manganese, iron, nickel and cobalt, and the balance essentially titanium and incidental impurities.

4. The temperature sensing element of claim 3 in which the metal is selected from the group consisting of vanadium and manganese.

5. The temperature sensing element of claim 1 in which the metal alloy is at least about 80% glassy.

6. The temperature sensing element of claim 5 in which the metal alloy is totally glassy.

7. A metal alloy that is at least 50% glassy having a composition consisting essentially of about 20 to 45 atom percent beryllium, about 2 to 80 atom percent zirconium, about 0.5 to 2 atom percent of at least one metal selected from the group consisting of vanadium, chromium, manganese, iron, nickel and cobalt, and the balance essentially titanium and incidental impurities.

8. The glassy metal alloy of claim 7 having a composition consisting essentially of about 35 to 45 atom percent beryllium, about 2 to 65 atom percent zirconium, about 0.5 to 1.5 atom percent of at least one metal selected from the group consisting of vanadium, chromium, manganese, iron, nickel and cobalt, and the balance essentially titanium and incidental impurities.

9. The glassy metal alloy of claim 8 having a composition consisting essentially of about 38 to 42 atom percent beryllium, about 8 to 12 atom percent zirconium, about 1 atom percent of at least one metal selected from the group consisting of zirconium, vanadium, chromium, manganese, iron, nickel and cobalt, and the balance essentially titanium and incidental impurities.

10. The glassy metal alloy of claim 9 in which the metal is selected from the group consisting of vanadium and manganese.

11. The glassy metal alloy of claim 5 in which the metal alloy is at least about 80% glassy.

12. The glassy metal alloy of claim 5 in which the metal alloy is totally glassy.

13. In a process for measuring low temperatures which comprises measuring a signal generated by a temperature sensing element of a resistance thermometer which is electrically connected to a temperature indication means, the improvement which comprises employing as the temperature sensing element a body of metal alloy that is at least 50% glassy having a composition consisting essentially of about 20 to 45 atom percent beryllium, about 2 to 80 atom percent zirconium, about 0.5 to about 2 atom percent of at least one metal selected from the group consisting of vanadium, chromium, manganese, iron, nickel and cobalt, and the balance essentially titanium and incidental impurities.

14. The process of claim 13 in which the composition consists essentially of about 35 to 45 atom percent beryllium, about 2 to 65 atom percent zirconium, about 0.5 to 1.5 atom percent of at least one metal selected from the group consisting of vanadium, chromium, manganese, iron, nickel and cobalt, and the balance essentially titanium and incidental impurities.

15. The process of claim 14 in which the composition consists essentially of about 38 to 42 atom percent beryllium, about 8 to 12 atom percent zirconium, about 1 percent of at least one metal selected from the group consisting of vanadium, chromium, manganese, iron, nickel and cobalt, and the balance essentially titanium and incidental impurities.

16. The process of claim 15 in which the metal is selected from the group consisting of vanadium and manganese.

17. The process of claim 13 in which the metal alloy is at least about 80% glassy.

18. The process of claim 13 in which the metal alloy is totally glassy.

* * * * *

UNITED STATES PATENT OFFICE
CERTIFICATE OF CORRECTION

Patent No. 4,064,757 Dated December 27, 1977

Inventor(s) Ryusuke Hasegawa

It is certified that error appears in the above-identified patent and that said Letters Patent are hereby corrected as shown below:

Col. 4, line 47, "K" should be "H".

Claim 1, Col. 5, lines 52-53 "1. A temperature sensing element, comprising for low temperature resistance thermometers" should read -- 1. A temperature sensing element for low temperature resistance thermometers, comprising --.

Signed and Sealed this

*Sixteenth* Day of *May 1978*

[SEAL]

*Attest:*

RUTH C. MASON
*Attesting Officer*

LUTRELLE F. PARKER
*Acting Commissioner of Patents and Trademarks*